(12) United States Patent
Xiang et al.

(10) Patent No.: US 8,566,761 B2
(45) Date of Patent: Oct. 22, 2013

(54) NETWORK FLOW BASED DATAPATH BIT SLICING

(75) Inventors: Hua Xiang, Ossining, NY (US); Minsik Cho, Austin, TX (US); Haoxing Ren, Austin, TX (US); Matthew M Ziegler, Sleepy Hollow, NY (US); Ruchir Puri, Baldwin Place, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/301,107

(22) Filed: Nov. 21, 2011

(65) Prior Publication Data

US 2013/0132915 A1      May 23, 2013

(51) Int. Cl.
*G06F 17/50*      (2006.01)

(52) U.S. Cl.
USPC ............................................ 716/102; 716/101

(58) Field of Classification Search
USPC ................................................. 716/100–106
See application file for complete search history.

(56) References Cited

U.S. PATENT DOCUMENTS

| | | | |
|---|---|---|---|
| 5,812,417 A | 9/1998 | Young | |
| 6,401,194 B1 | 6/2002 | Nguyen et al. | |
| 6,449,628 B1 | 9/2002 | Wasson | |
| 7,073,143 B1 * | 7/2006 | Huang | 716/106 |
| 7,149,916 B1 | 12/2006 | Marino | |
| 7,243,087 B2 | 7/2007 | Iyer | |
| 7,337,418 B2 * | 2/2008 | Kale et al. | 716/106 |
| 7,356,095 B2 | 4/2008 | Dagdeviren et al. | |
| 7,376,922 B2 | 5/2008 | Rushing et al. | |
| 2002/0144227 A1 | 10/2002 | Das et al. | |
| 2003/0061466 A1 | 3/2003 | Samra et al. | |
| 2005/0031055 A1 | 2/2005 | Ernst | |
| 2008/0270065 A1 | 10/2008 | Kampf et al. | |
| 2010/0011324 A1 | 1/2010 | Faulkner et al. | |

OTHER PUBLICATIONS

Das et al.;"An Efficient and Regular Routing Methodology for Datapath Designs Using Net Regularity Extraction", IEEE Transactions on Computer-Aided Design of Integrated Circuits and Systems, vol. 21, No. 1, Jan. 2002, pp. 93-101.

Munch et al.; "Optimum Simultaneous Placement and Binding for Bit-Slice Architectures", Design Automation Conference, 1995. Proceedings of the ASP-DAC '95/CHDL '95/VLSI '95., IFIP International Conference on Hardware Description Languages; IFIP International Conference on Very Large Scale Integration., Asian and South Pacific, Aug. 1995, pp. 735-740.

Leveugle et al.; "Datapath Implementation: Bit-Slice Structure Versus Standard Cells", Euro ASIC '92, Proceedings, Jun. 1992, pp. 83-88.

Duzy, P.; "SPEED—A Highly Flexible Slice Structure and Datapath Generator", IEEE 1988 Custom Integrated Circuits Conference, May 1998, pp. 14.6.1-14.6.4.

* cited by examiner

*Primary Examiner* — Binh Tat
(74) *Attorney, Agent, or Firm* — Preston Young

(57) ABSTRACT

The present disclosure relates to a computer-based method and apparatus for determining datapath bit slices. A first two-way search is performed between an input vector and an output vector to identify gates in a datapath. A network flow is then constructed including the gates identified, and a min-cost max-flow algorithm is applied to the network flow to derive matching bit pairs between the input vector and the output vector. Next, the datapath bit slices are determined by performing a second two-way search between each of a starting bit in the input vector and an ending bit in the output vector of each of the matching bit pairs.

18 Claims, 15 Drawing Sheets

NETWORK FLOW BASED DATAPATH BIT SLICING

FIELD OF THE DISCLOSURE

The present invention relates generally to design automation, and relates more particularly to the design and layout of large-scale, high-performance circuits.

BACKGROUND OF THE DISCLOSURE

In deep sub-micro designs, more functions are integrated into one chip, and datapath has become a critical part of the design. A typical datapath comprises an array of bit slices. However, existing design methodologies may generate inferior datapath designs because the datapath regularity cannot be well understood by traditional design tools. For example, several techniques are proposed to preserve/re-identify datapath structures. However, such techniques either restrict the datapath optimization or have little tolerance on bit slice difference.

SUMMARY OF THE DISCLOSURE

In one embodiment, the present disclosure is a computer-based method for determining datapath bit slices. A first two-way search is performed between an input vector and an output vector to identify gates in a datapath. A network flow is then constructed including the gates identified, and a min-cost max-flow algorithm is applied to the network flow to derive matching bit pairs between the input vector and the output vector. Next, the datapath bit slices are determined by performing a second two-way search between each of a starting bit in the input vector and an ending bit in the output vector of each of the matching bit pairs.

BRIEF DESCRIPTION OF THE DRAWINGS

The teachings of the present disclosure can be readily understood by considering the following detailed description in conjunction with the accompanying drawings, in which.

To facilitate understanding, identical reference numerals have been used, where possible, to designate identical elements that are common to the Figures.

DETAILED DESCRIPTION

In the deep submicron design era, the level of chip integration increases dynamically with very aggressive goals. Consequently, identifying a datapath has become a critical part of chip design. A datapath comprises bit slices to obtain the necessary word size. It has been observed that for many bit slices, they have the same or similar functions and structures to other bit slices. Thus, in various embodiments of the present disclosure, the inherent high degree regularity of datapaths is exploited such that all gates in one bit slice are aligned to achieve regular layouts with high performance and small areas. For example, embodiments of the present disclosure implement a novel approach to identify datapath bit slices. Contrary to previous template-based approaches, embodiments of the present disclosure convert the bit slicing problem to a bit matching problem.

In one embodiment, an efficient two-way search algorithm is used to identify datapath related gates. Based on the identified gates, a flow network, or "netflow", is constructed. For example, in one embodiment a minimum-cost maximum-flow algorithm, or "min-cost max-flow" algorithm, is applied to the flow network to derive a bit matching between the input vector and output vector. In general, the minimum-cost maximum-flow problem is to compute a maximum flow at minimum cost for a graph. Techniques to perform this computation are referred to as min-cost max-flow algorithms. Once the bit matching is determined, a second two-way search algorithm is applied between each pair of starting and ending bits to get a corresponding bit slice. In addition, in various embodiments, the bit slicing solution is improved with an iterative method. Experimental results demonstrate the effectiveness and efficiency of the present embodiments.

Figure 1:
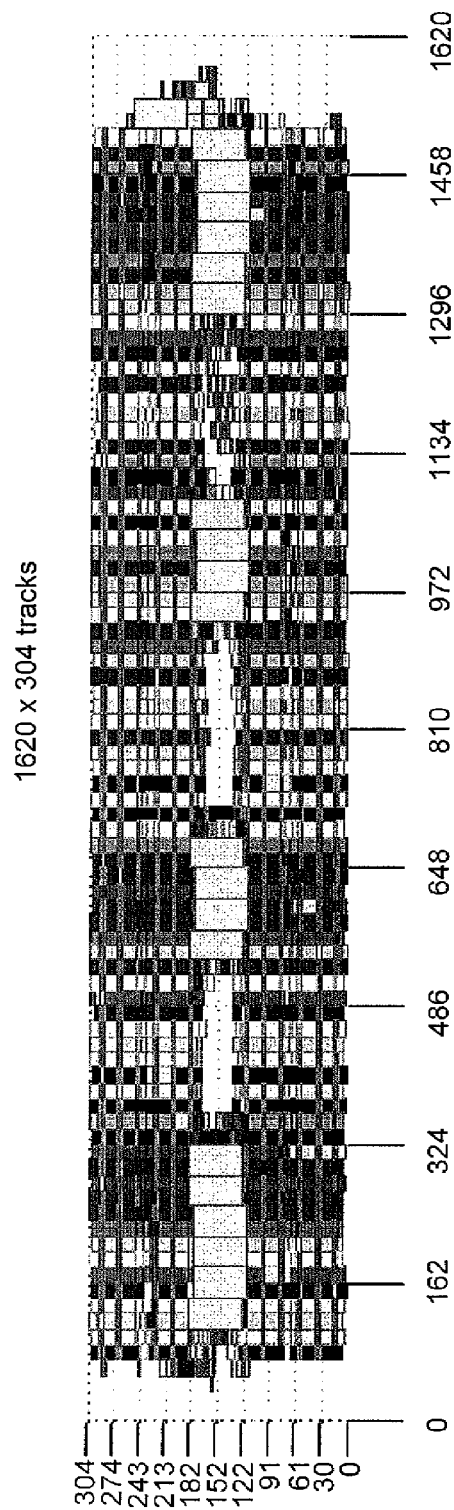
FIG. 1 illustrates a high level view of an exemplary datapath layout, according to the present disclosure.

By way of example, FIG. 1 shows a datapath dominant macro, according to one embodiment of the present disclosure. All bit slices are aligned as shaded to produce the high density design. It should be noted that in other embodiments, bit slices may be indicated by different coloring, in addition to or as an alternative to shading. Notably, this kind of placement is hard to achieve through existing techniques (e.g., general placement, by hand). More specifically, traditional design tools are not well suited for optimal layout of high-performance datapaths since regularity is not an apparent feature of typical digital system descriptions. As a result, in prior techniques, a datapath is either manually designed to exploit the regularity, or totally ignored to be treated as ordinary logic structures.

For example, several prior techniques and algorithms have been proposed to deal with datapaths. Overall, the datapath handling can be classified into two categories. The first approach attempts to preserve the datapath structure; from hardware description language (HDL) throughout the synthesis process. Although this may sufficiently maintain the regularity, it also limits the optimization ability since parts of a datapath cannot be processed independently. For example, a gate in one bit line can be resized for better timing. But in order to keep the regularity, all the equivalent gates in other bit lines have to be resized in the same way as well. Due to area or other constraints, the resizing optimization may fail. A second approach attempts to re-identify datapath structures during/after synthesis for optimization.

A common feature in each of these approaches is to extract datapath regularity to cover the design with either pre-defined library templates or automatically generated templates. However, template extraction requires creating all equivalent classes of the circuit graph under isomorphism, and then covering the design to find the exact match against templates.

Notably, after synthesis and technology mapping, the datapath bit lines may not be kept the same. Thus, it is also possible that not all bit lines have the same functionality.

Figure 2:
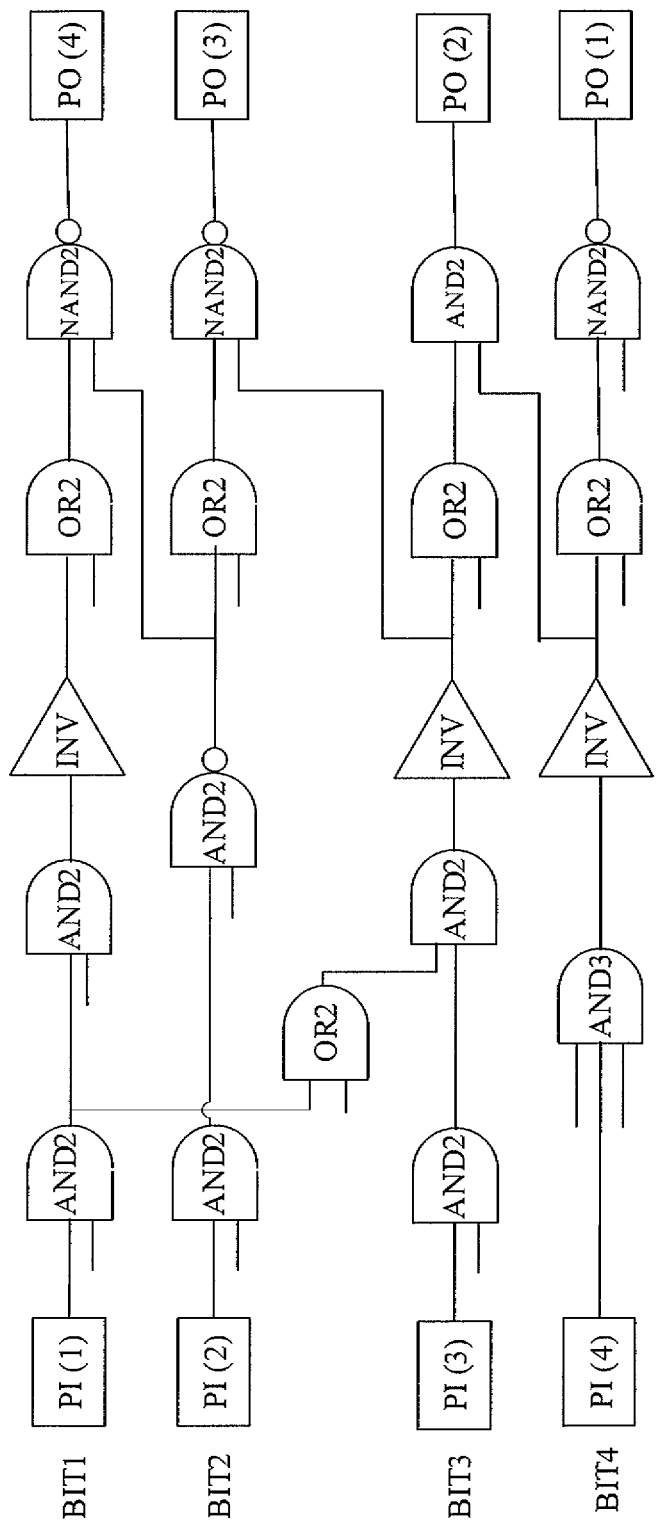
FIG. 2 is a schematic diagram illustrating one embodiment of a datapath, according to the present disclosure.

To illustrate, FIG. 2 shows an exemplary circuit design 200 that includes bit lines having different functionalities. In FIG. 2, the datapath is from an input vector, PI, to an output vector, PO, each with 4 bit slices (also referred to as "bit lines"). Among these four bit lines, Bit Line 3 (PI(3)→PO(2)) has a different logic function than the others (the last gate along the path is AND2 instead of NAND2). Accordingly, while the four bit slices are very close, they are all still different.

In general, applying a template-based method on a datapath may result in some pieces of the bit slices with the same structure, but not the whole of the bit slices. On the other hand, if the placer (e.g., an automated gate placement tool) and router (e.g., an automated tool for interconnecting the gates) can be informed with the alignment constraints on bit lines, it may assist in producing high density and routing friendly design.

Accordingly, various embodiments of the present disclosure focus on bit slices instead of regularity. Typically, a datapath (or datapath segment) starts from input latch vectors (PI), and ends at output latch vectors (PO) (e.g., as illustrated in FIG. 2). The names of PI/PO/latch vectors are usually featured as a string ending with an index (e.g., PO result(0), PO result(1), etc.), and they are seldom changed during synthesis. In any event, in one embodiment an attribute is set on these PI/PO gates to indicate that they are vectors. Therefore, the vectors can be identified in the physical design stage. Once the starting/ending vectors are given, the corresponding datapath can be determined.

According to various embodiments of the present disclosure, one of the overall goals is to identify bit slices in a datapath such that the bit slices have similar structure. Formally, given a datapath input vector $S=(s_1, \ldots, s_n)$ and its output vector $T=(t_1, \ldots, t_n)$, the goal is to identify the n bit slices such that the n bit slices have similar structures. In an exemplary design, a datapath may have multiple stages which are usually indicated by latch banks. For example, a datapath could be PI→LatchBank1→LatchBank2→PO. For such a datapath, one can start from the inputs (i.e., the input vector PI), and perform bit slicing stage by stage. By way of example, S and T denote two adjacent vectors (the input vector and output vector respectively, for a particular stage). For purposes of the example, it is assumed that there are no connection circles between the two adjacent vectors S and T.

Although the ultimate goal is to create bit slices, or bit lines, with the same or similar structures, in practice it is difficult to directly exploit the inherent similarities since it requires the comparison between two objects. When the bit slice template is unknown, the objects to compare are also unknown. However, in accordance with embodiments of the present disclosure, if the starting points are matched to the ending points, the gates between a pair of matched points can be extracted to make one bit slice. Therefore, contrary to the previous template-based approaches, embodiments of the present disclosure address the bit slicing problem by determining the matching between the starting bits and the ending bits such that the matching leads to producing bit slices. In addition, an optimization algorithm is applied to determine a set of bit slices having similar structures.

Along the datapath, if all operations are vector based, the bit lines might be clear. However, in real design, most datapaths are a combination of vector and scalar operations. Even at the VHDL (very-high-speed integrated circuit hardware description language)/HDL (hardware description language) level (except when users specify the bits), it is not a trivial thing to determine the bit slices, since the index of a vector has no logic meaning. For example, one bit of the starting/input vector can have connections to multiple bits of the ending/output vector. As shown in FIG. 2, PI(1) has paths to both PO(2) and PO(4). Thus, it is not straightforward to match bits.

Embodiments of the present disclosure solve the bit slicing problem, i.e., by finding a bit slicing solution, or identifying a set of bit slices in a datapath, with a new approach. In one embodiment, an efficient two-way search algorithm is used to identify datapath related gates based on the datapath input and output vectors. In addition, in one embodiment, the datapath is represented as a network flow (netflow) and a network flow based algorithm is used to identify a main frame of the netflow. Although each bit slice can be different, there may exist a main path, or "main frame," between a starting point and a corresponding ending point. The novel concept of a datapath main frame is defined as comprising a set of disjoint paths from the starting vector to the ending vector such that these paths cover the maximum number of datapath gates. In one embodiment, a min-cost max-flow based algorithm is used to identify the main frame of the datapath. The identification of the main frame results in a matching between the starting points and the ending points. Once the starting points are matched to the ending points (e.g., through the main frame solution), the datapath gates between a pair of matched points are extracted to make one bit slice. In one embodiment, the gates in each bit slice are extracted by performing a second two-way search. In addition, various embodiments are described below that employ two novel techniques to create more optimal main frame solutions. For example, in one embodiment an iterative approach is exploited to further improve the datapath bit slicing solution.

It should be noted that as described herein, a bit slice refers to an input bit in an input vector or array and an associated output bit in an output vector or array, as well as all gates between the two bits. A bit slicing solution is a solution that matches all input and output bits into bit slices and identifies all gates in each bit slice between each input bit/output bit pair (or bit slice). An optimal bit slicing solution is a solution that maximizes the number of gates in each bit slice. The optimal bit slicing solution is closely related to the identification of a main frame solution, since the optimal bit slicing solution can be derived from the main frame solution. As described herein, a main frame, once determined/identified, may sometimes be referred to as the "main frame solution" or a "main frame identification solution." However, a main frame solution does not necessarily identify all the gates between each input bit/output bit pair for each bit slice; it only indicates the longest paths between input bits and output bits, and the gates in such longest paths. In one embodiment, the actual gates in a bit slice between an input bit and an output bit identified using a second two-way search. The discussion below explains these concepts in further detail.

Two-Way Search Extraction

For any gate related to the given datapath, one important feature is that this gate must have at least one net connection path to both the starting vector and the ending vector. Therefore, if a path is traced from one side to the other, a datapath related gate must appear in the search. Accordingly, in one embodiment, a two-way search extraction algorithm initializes each gate in the design with a mark 0. Then a breadth-first-search algorithm is applied along the fan-out cone of S (a starting vector). The search stops when it hits T (an ending vector), a latch, a PO (an output/ending vector), or any gates that are identified as not related to the datapath. For each gate appearing in the search, its mark is increased by 1. Similarly, another search (e.g., a breadth-first search) is applied from T.

For each gate appearing in the search, its mark is increased by 1. Thus, if a gate has a mark of 2, it means it has connections to both S and T, and this gate is accepted as a datapath related gate. In one embodiment, the two-way search algorithm is performed as follows.

Algorithm. Two_Way_Search_Extraction (S, T):
1. Initialize each gate g in the design with $mark_g=0$;
//forward search
2. Start from S to do breadth-first-search along output nets;
3. For any gate g in the search, $mark_g$++;
//backward search
4. Start from T to do breadth-first-search along input nets;
5. For any gate g in the search, $mark_g$++;
6. Let $G_d=(V_d, E_d)$, where
7. $V_d$ is a set of gates whose mark is 2;
8. $E_d$ is the netlist for $V_d$;
9. Return $G_d$;

As described above, in one embodiment, part of the two-way search extraction algorithm includes a breadth-first-search. In the case of a breadth-first search, its runtime is bounded by O(p+q) where p is the number of gates in the design, and q is the number of nets. The initialization and the $G_d$ (the datapath graph including all datapath related gates and their connections) generation only need traverse all gates once. Therefore, the total runtime of the extraction algorithm using breadth-first searching is O(p+q). However, it should also be noted that in some embodiments a two-way search may comprise a depth-first search, or any other general search algorithm.

Note that any gate in one bit slice must have paths to both its starting bit and its ending bit as well. This feature is exploited later where the two-way search extraction is also used to extract one bit slice by letting S be the starting bit and T be the ending bit.

Datapath Bit Matching

By applying a two-way search extraction, an underlying connection graph is obtained for the given datapath. However, the graph only shows the connectivity between two vectors. It is therefore further necessary to identify the bit lines from the graph. The specialty of datapath bit lines lies in their regularity/similarity. Regularity requires equivalence between two pieces. But in real design, even if all bit lines have the same logic function, they may still have different implementations, since the traditional tools have no knowledge of the datapath structure, and each bit line might be processed independently. Therefore, except bit structures that are well preserved from the very beginning of the design process, in most cases, the datapath bit slices have similar, but different structures.

Notably, similarity draws on the comparison between two objects. For instance, a bit line can be compared with a bit line template, or another bit line. However, bit line templates with "similar" features are even more difficult to generate than templates with "equivalence". In addition, attempting to perform a datapath bit slicing is additionally challenging where the bit lines are not yet available.

Formally, the datapath bit matching problem can be defined as follows: given a datapath input vector S=(s1, . . . , sn) and its output vector T=(t1, . . . , tn), identify the one-to-one matching between S and T such that n bit slices extracted based on their input/output bits have similar structures.

One intuitive way to solve the bit matching problem is to enumerate all possible matching solutions between two vectors. Although a typical datapath usually has limited connections between bit lines (e.g., a starting vector bit has paths connecting to at most only two ending vector bits), the number of the total matching solutions is still as large as $2^{n/2}$, where n is usually larger than 8, such as 32 or 64.

In prior approaches, a bipartite graph has been used to solve the matching problem (e.g., to determine one-to-one matching solution(s)). However, for bit slicing problems, it is not easy to set up a bipartite graph since the weight between a pair of starting and ending bits cannot be calculated independently. For example, in FIG. 2, the paths PI(1)→PO(3) and PI(3)→PO(2) share two gates (one AND2 and one INV).

Finally, the datapath bit slicing problem is also different from partition problems. For partition problems, the target is to assign gates into n sets such that the union of the n sets covers all the gates with certain balancing constraints satisfied. However, for bit slicing, one fundamental difference is that not all gates need get assigned to a bit slice. For example, the OR gate between Bit2 and Bit3 in FIG. 2 doesn't belong to any bit line.

In contrast to the above, embodiments of the present disclosure exploit the novel insight that if its starting and ending bits are known, a two-way search extraction (a second two-way search extraction) can be performed between each pair of starting/ending bits, thereby deriving a full bit slice. In other words, the challenge of bit slicing is converted into a bit matching problem, also referred to herein as the main frame identification (MFI) problem. By applying a min-cost max-flow algorithm, the MFI problem can be optimally solved in polynomial time. Thereafter, a bit matching solution can be determined from the corresponding MFI solution using a second two-way search. In various embodiments, the process of datapath bit matching comprises both creating a network flow, or netflow, and then identifying the main frame of the netflow by applying a min-cost max-flow algorithm to the netflow.

Main Frame Identification

Embodiments of the present disclosure exploit the following novel observations:
(1) In general, all bit slices carry similar number of gates;
(2) The connections among bit slices are limited;
(3) All bit slices usually have at least one similar path from the input bit to the output bit, and the path is disjoint with the similar paths in other bit lines.

As described above, it is not straightforward to get bit slices directly. On the other hand, it is relatively easier to get a part of each bit slice. In addition, if the part can be used to determine the input/output bit of that slice, the bit matching solution can be obtained. Accordingly, embodiments of the present disclosure are designed to find the main frame of a datapath, i.e., among all the similar paths from each bit line, find a longest one (note there may be several "longest" paths, each having equal length). However, this description still draws on "similarity". On the other hand, it is observed that for typical datapaths, any n disjoint paths won't have more gates than the total number of datapath gates from the n longest similar paths. This concept is therefore transformed into to the following definition: Datapath Main Frame— Given a datapath with n bits, its main frame is a set of n disjoint paths from the input to the output such that the number of datapath gates on these paths is maximized.

To identify the datapath main frame, it is necessary to solve the main frame identification (MFI) problem, defined as: Main Frame Identification (MFI)—Given a datapath input vector S=(s1, . . . , sn) and its output vector T=(t1, . . . , tn), identify n disjoint paths from S to T such that the n paths cover as many datapath gates as possible.

In MFI solutions, the n disjoint paths correspond to the n paths in n bit slices. Meanwhile, the n paths try to cover as many gates as possible. This implicitly forces the longest similar paths.

In various embodiments, a network flow based algorithm (MFI_by_Flow) is implemented to optimally solve MFI problems. The inputs S and T are the starting and ending vectors of a datapath, respectively. $G_d=(V_d, E_d)$ is the datapath graph obtained by two-way search extraction algorithm, where $V_d$ is the datapath gate set, and $E_d$ is the datapath netlist.

Algorithm MFI_by_Flow(S, T, $G_d$)
1. Construct the network graph $G_f=(V_f, E_f)$ based on $G_d$;
2. Assign capacities $U_f$ and costs $C_f$;
3. Apply min-cost max-flow algorithm on $G_f$;
4. Derive disjoint paths from S to T;
5. Return the datapath matching result;

With regard to the first step, in one embodiment, based on the datapath graph $G_d=(V_d, E_d)$, a flow network is constructed as follows:
1. $V_f=\{s, t\} \cup V_d$, where s is the source node, t is the sink node.
2. $E_f=\{(s, s_i)|s_i \in S, i=1 \ldots n\} \cup E_d \cup \{(t_i, t)|t_i \in T, i=1 \ldots n\}$.
3. Node Capacity: for $v \in V_d$, $U_f(v)=1$.
4. Edge Capacity: for $e \in E_f$, $U_f(e)=1$.
5. Node Cost: $C_f(s)=C_f(t)=0$; for $v \in V_d$, $C_f(v)=-C_n$, where $C_n$ is a positive integer;
6. Edge Cost: for $e \in E_f$, $C_f(e)=0$.

As can be seen in the algorithm, after constructing the flow graph the min-cost max-flow algorithm is applied on the flow network.

Figure 3:
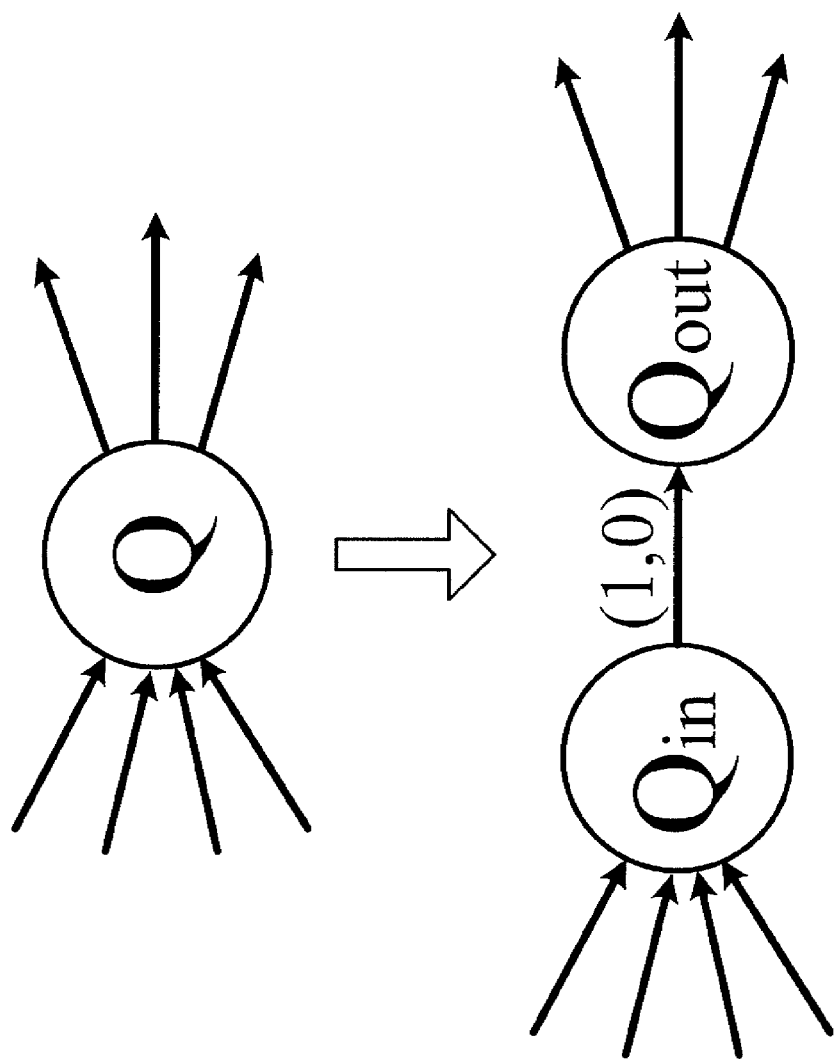
FIG. 3 illustrates one example of node splitting, according to the present disclosure.

Certain modifications to classical network flow solutions are implemented in various embodiments to support the determination of datapath bit slices. In particular, since the target of MFI is to maximize the number of identified gates, each gate is assigned with a negative cost $-C_n$. Thus the more gates on the flow, the less cost. In addition, the classical network flow problem only assigns capacities and costs on flow edges. Accordingly, in embodiments of the present disclosure, node capacity/cost is addressed by splitting a node, Q, into two nodes $Q_{in}$ and $Q_{out}$. The concept of node splitting is illustrated in FIG. 3. One edge is added between $Q_{in}$ and $Q_{out}$ and is assigned the node capacity and cost as the edge capacity and cost, respectively. Then all the original incoming edges are pointed to $Q_{in}$ while all the original out-coming edges are connecting from $Q_{out}$.

Figure 4A:
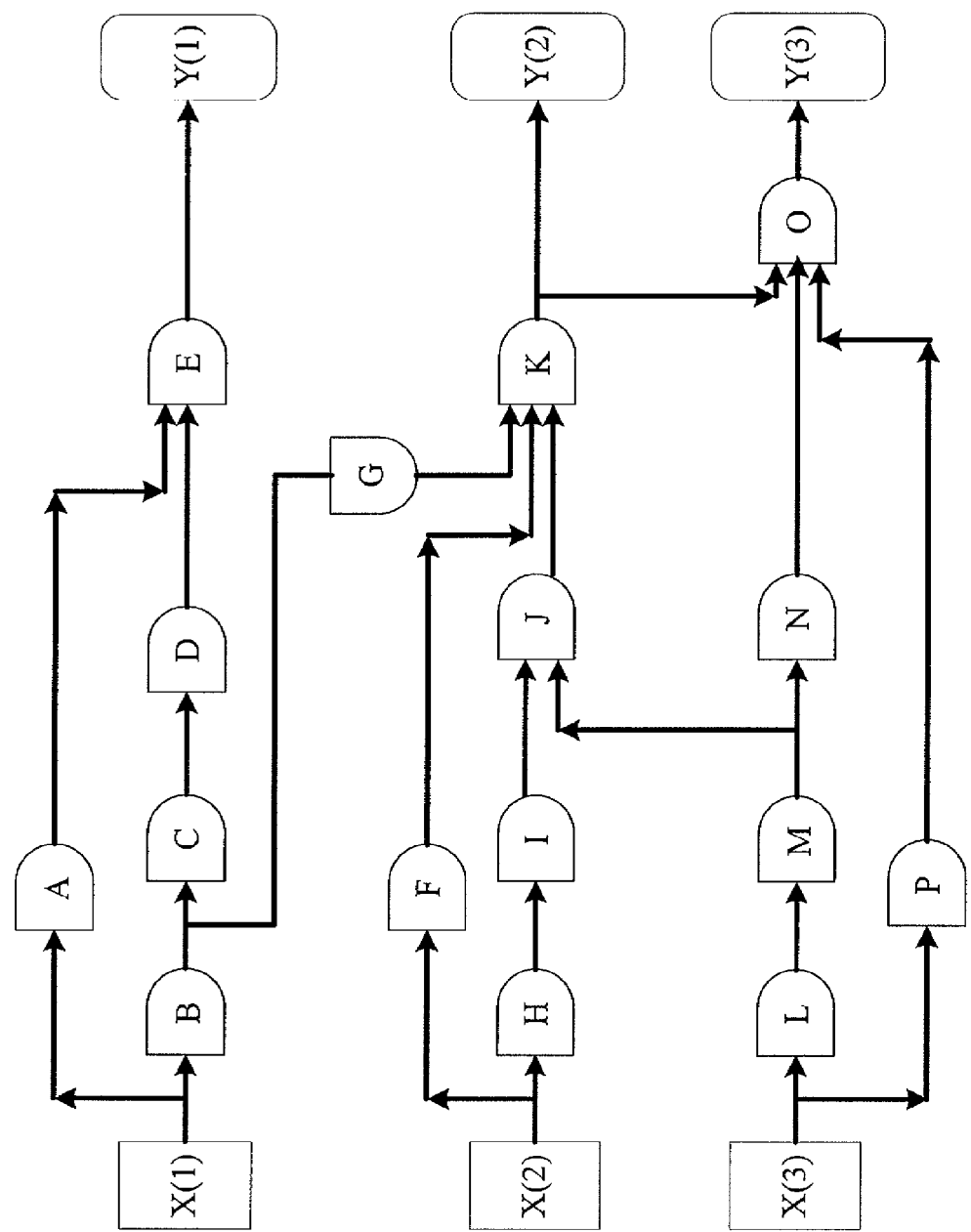
FIGS. 4(A) and 4(B) illustrate one embodiment of flow network construction, according to the present disclosure.
Figure 4B:
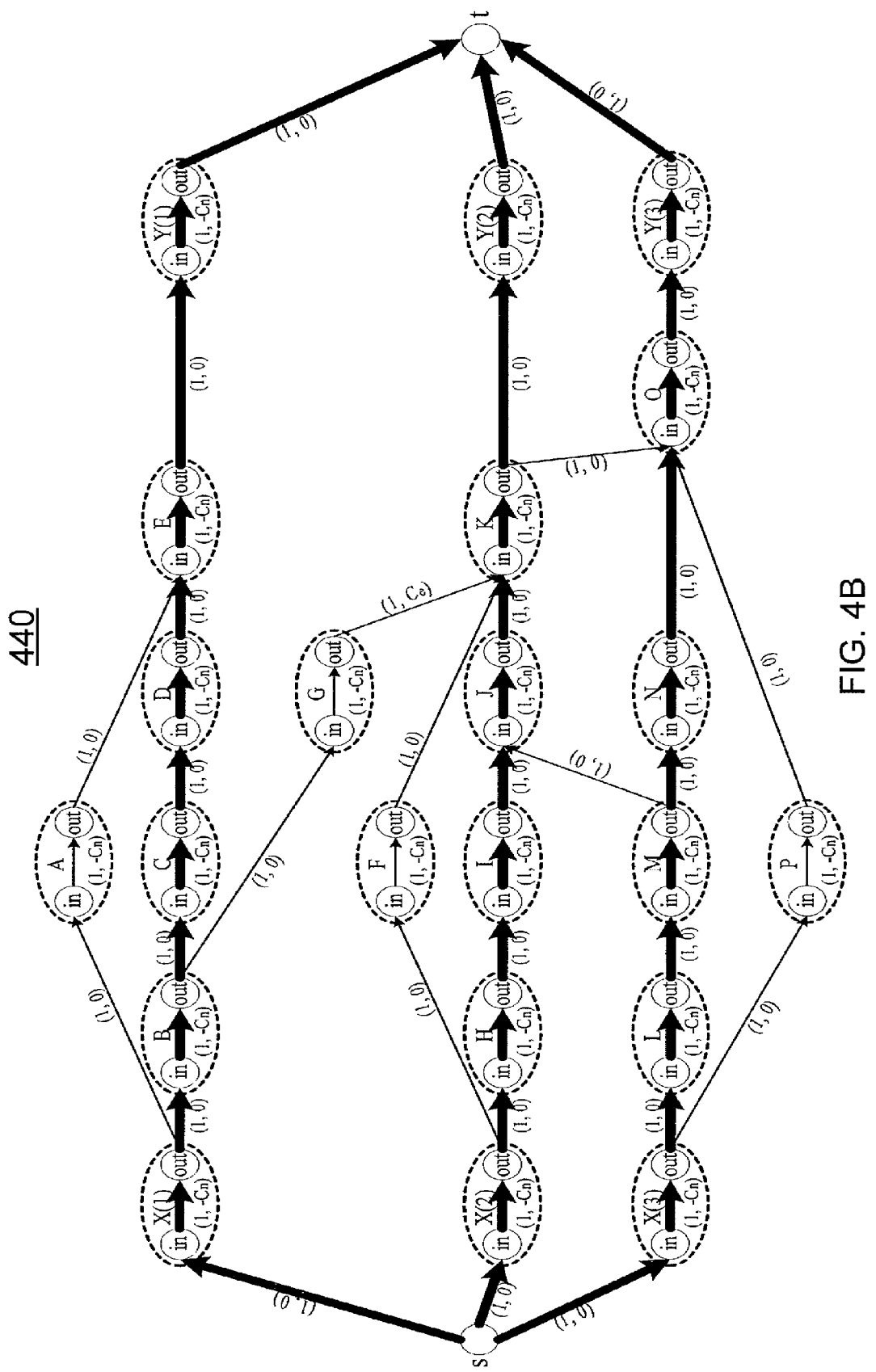

FIGS. 4(A) and 4(B) show an example of flow network construction according to one embodiment of the present disclosure. As illustrated in FIG. 4(A), the input vector is X=(x1,x2,x3), and the output vector is Y=(y1,y2,y3). In one embodiment, FIG. 4(A) represents a datapath gate graph 420 obtained from the two-way search extraction described above. Visually, it can be seen that there are three bit lines, and each bit line has two paths from the input bit to the output bit. For example, the bit line between X(1) and Y(1) includes gates A, B, C, D and E, and the two paths are X(1)→A→E→Y(1) and X(1)→B→C→D→E→Y(1). Similarly, the bit line between X(2) and Y(2) includes gates F, H, I, J and K while the bit line between X(3) and Y(3) includes gates L, M, N, O and P. Also there are some net connections among these three bit lines (e.g., between gates M and J, between gates K and O, between gates B and K via gate G). As shown in FIG. 4(B), the datapath gate graph 420 of FIG. 4(A) is converted into a flow network 440. Each gate in the datapath is represented by two nodes (in and out), and the edge (in, out) has a capacity 1 and cost $-C_n$. By applying a min-cost max-flow algorithm on this network, the flow solution (i.e., the main frame solution, or MFI solution) shown by the thick lines in FIG. 4(B) is obtained. Finally, by tracing the flow paths in FIG. 4(B), it is easy to derive the bit matching as X(1)→Y(1), X(2)→Y(2), and X(3)→Y(3). Since the gate edge cost is made negative, the optimality of the min-cost max-flow algorithm guarantees that the maximum number of gates is identified: the more gates found, the less cost.

Finding a min-cost max-flow solution in a flow network is a classical problem, and several polynomial min-cost max-flow algorithms are available. For example, in one embodiment a double scaling algorithm is used, with a time complexity bounded by $O(|V_f| \cdot |E_f| \log |V_f|)$ where $|V_f|$ is the number of nodes in the flow network, and $|E_f|$ is the number of edges. Both $|V_f|$ and $|E_f|$ are linearly bounded by the gates and nets in the datapath graph, respectively. This leads the following theorem.

Theorem 1

The MFI by Flow algorithm can exactly solve the MFI problem as long as one solution exists. The algorithm runtime is bounded by $O(|V_d| \cdot |E_d| \log |V_d|)$ where $|V_d|$ and $|E_d|$ are the number of gates and nets in the datapath graph which is obtained by applying two-way search extraction on the given input and output datapath vectors.

Once a bit matching is obtained through MFI_by_Flow (in other words, once the main frame solution or MFI solution is identified), the starting and ending points of each of the bit slices are known. As illustrated in FIG. 4(A), there are three bit lines, and each bit slice includes five gates.

In one embodiment, once the bit matching is determined, a two-way search extraction is again performed. This second two-way search extraction uses each starting/ending bit pair to get the bit slices (i.e., to identify the gates between the starting bit and the ending bit of each bit slice). In particular, if a gate has connectivity to both the starting bit and the ending bit, then the gate is in the bit slice associated with the start bit/end bit pair. As described herein, the set of resulting bit slices determined by this process may be referred to as a bit slicing solution.

The above described processes illustrate exemplary features of the present disclosure. However, in various embodiments, additional features may further be employed in addition to/or in conjunction with the foregoing. Examples of such additional features are described below.

Optimal MFI Solution Generation

MFI by Flow draws on a min-cost max-flow algorithm to find an optimal MFI solution. However, a MFI problem may have multiple optimal solutions, and different optimal solutions may lead to different bit slices as well. For example, there may be several unique solutions, each being optimal (e.g., resulting in the greatest number of gates per bit slice, in accordance with the datapath main frame definition above). Different min-cost max-flow algorithms may return different optimal results (in general, min-cost max-flow algorithms return a single "solution" regardless of whether there are other equally "optimal" solutions).

Figure 5A:
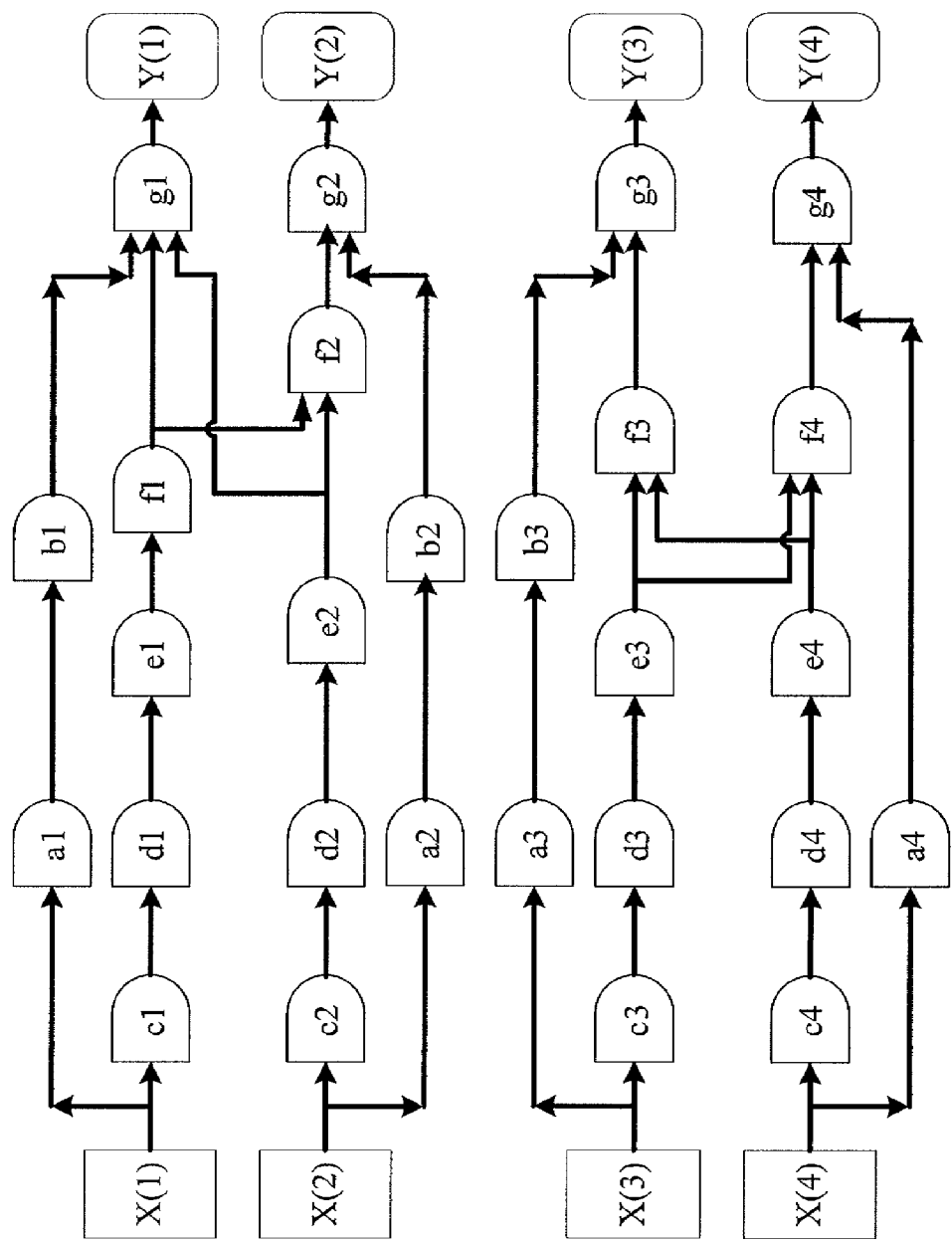
FIGS. 5(A)-5(C) illustrate one embodiment of multiple optimal main frame identification solutions, according to the present disclosure.
Figure 5B:
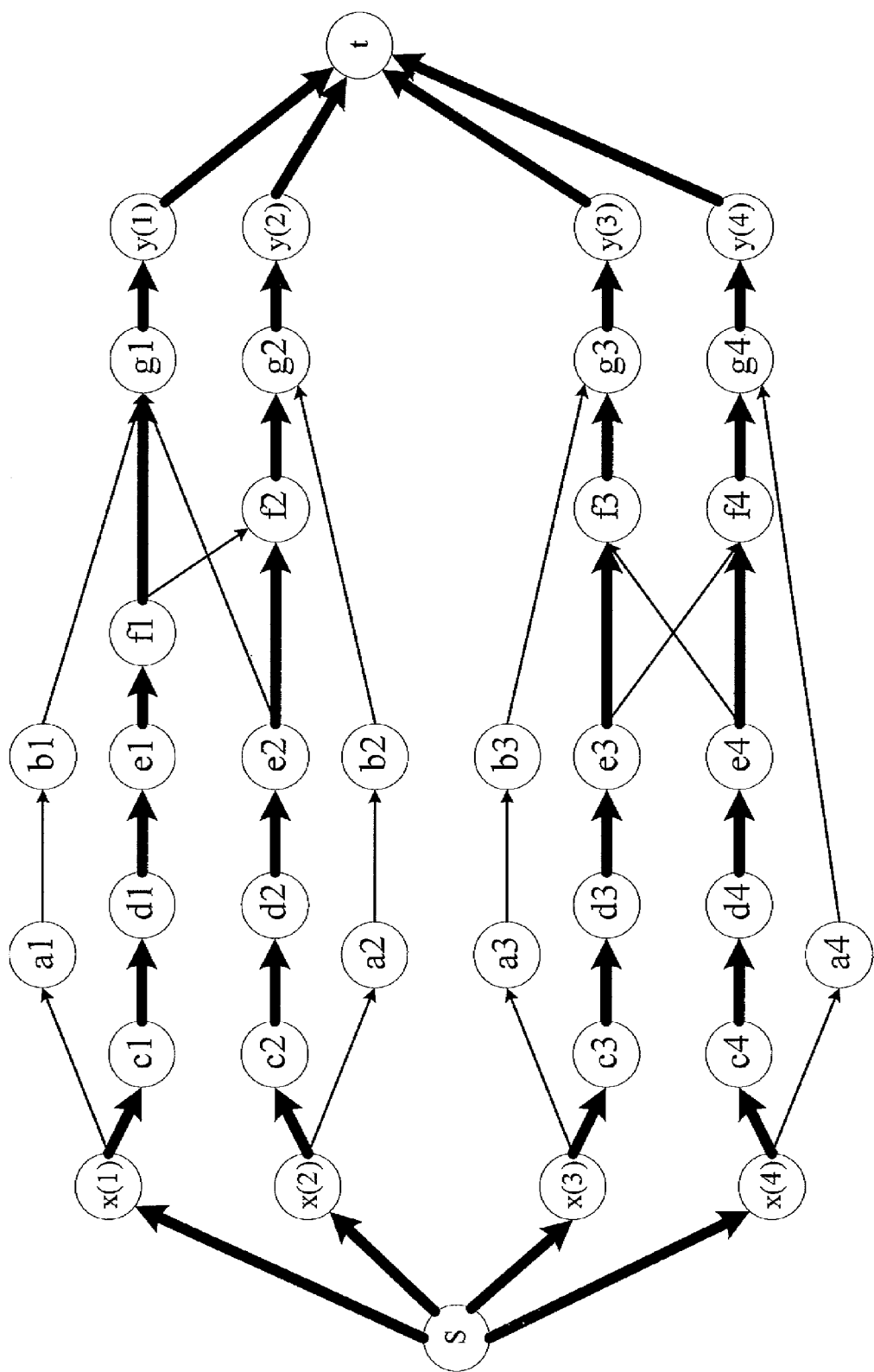
Figure 5C:
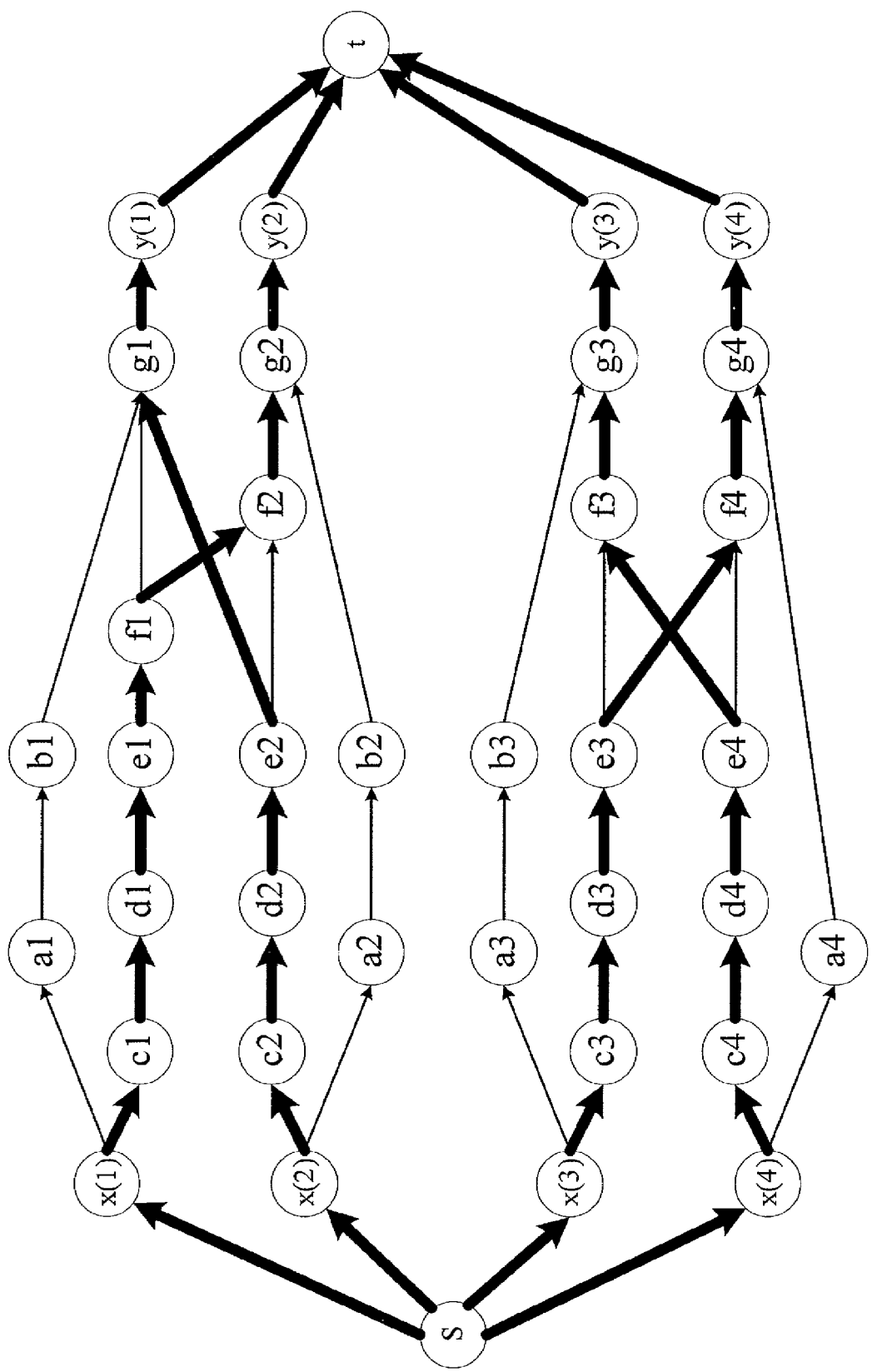

FIGS. 5(A)-5(C) give an example of multiple optimal MFI solutions, according to embodiments of the present disclosure. FIG. 5(A) illustrates a datapath including four bit lines. FIG. 5(B) shows one corresponding constructed flow network 520 (e.g., created per MFI_by_Flow). To simplify the representation, the in node and out node are represented by one gate node. The thick lines in the flow graph are the flow results with the min-cost max-flow algorithm.

Based on the bit matching solution from FIG. 5(B), the four bit slices are:
Bit1: X(1)→Y(1) with seven gates;
Bit2: X(2)→Y(2) with seven gates;
Bit3: X(3)→Y(3) with seven gates;
Bit4: X(4)→Y(4) with six gates.

It should be noted that while a main frame solution will identify the longest paths, each resulting bit slice is not necessarily limited to only gates in the longest path. Rather, the bit slice may include additional gates and/or multiple paths between a starting bit and an ending bit, depending upon the gates which are found between the starting bit and the ending bit via the second two way search.

The bit matching solution of FIG. 5(B), illustrates one example of an optimal MFI solution. However, another implementation of a min-cost max-flow algorithm may result in different bit slices, providing a different, yet still optimal MFI solution. To resolve this issue, two methods are proposed to create additional optimal MFI solutions. One is to change the flow network, and the other is build a new optimal MFI solution based on two or more previously found optimal MFI solutions.

Flow Adjustment

Since generally min-cost max-flow algorithms are deterministic (i.e., they return only one optimal solution), one way to generate additional optimal solutions is to vary the search algorithm (e.g., double scaling, breadth-first search, depth-first search, uniform cost search, and the like) which may each return different optimal solutions. In some embodiments, another way to generate additional optimal solutions is to change the flow network, as described below.

For two solutions to both be optimal solutions, they must include the same number of gates (it is also likely that they are covering the same set of gates). In addition, the number of edges in two optimal solutions is also the same since the flow results are paths from one end to the other. However, the two sets of edges must be different, especially the two sets of net edges (i.e., edges corresponding to the nets in the datapath graph).

In one embodiment, a first optimal MFI solution is obtained. Then, the cost of net edges is adjusted to generate different optimal MFI solutions. In one embodiment, the adjustment to the flow network is performed according to the following algorithm:

Algorithm. Adjust_Flow_Network_Cost($G_f$, $G_d$, flow)
1. for each edge e in the flow
2. if e corresponds to a net in $G_d$
3. then $C_f(e) += \sigma$ For each edge in the flow, if it is a net edge in the datapath graph $G_d$, then increase its cost with a small positive number $\sigma(\sigma \ll C_n)$. Since the edge cost is much smaller than the gate cost, it will not affect the solution optimality, i.e., the number of gates in the flow won't be decreased. On the other hand, after the flow network adjustment, if there is another MFI optimal solution, the min-cost max-flow algorithm will identify a new one. For example, assume in FIG. 5(B) that the gate cost is −100, and the edge cost is zero. Suppose the edge cost is increased to one for the thick edges in FIG. 5(B) excluding the edges connecting with s or t. When the same min-cost max-flow algorithm again on this flow network, the original flow solution is not an optimal solution any more since its cost is −100·28+1·24=−2776. (In total, twenty-eight gates and twenty-four net edges). On the other hand, the solution shown in the network flow illustrated in FIG. 5(C) now has a total cost −100·28+1·20+0·4=−2780. As such, the solution of FIG. 5(C) now has a lower cost than that of FIG. 5(B) and is identified as an additional optimal solution. The bit slices illustrated in FIG. 5(C) are:

Bit 1: X(1)→Y(2) with six gates;
Bit2: X(2)→Y(1) with four gates;
Bit3: X(3)→Y(4) with five gates;
Bit4: X(4)→Y(3) with five gates.

By iteratively adjusting the flow network as described, additional optimal MFI solutions can be obtained. While the bit slicing solution from FIG. 5(B) appears to be the better, since each slice has closer structures and covers the same number of gates, in some cases the latter identified optimal solution(s) may in fact be better than the original result depending upon the particular flow network and the particular min-cost max-flow algorithm applied (e.g., double scaling, breadth-first search, depth-first search, uniform cost search, and the like).

Group-Piece Based Flow Creation

Figure 6A:
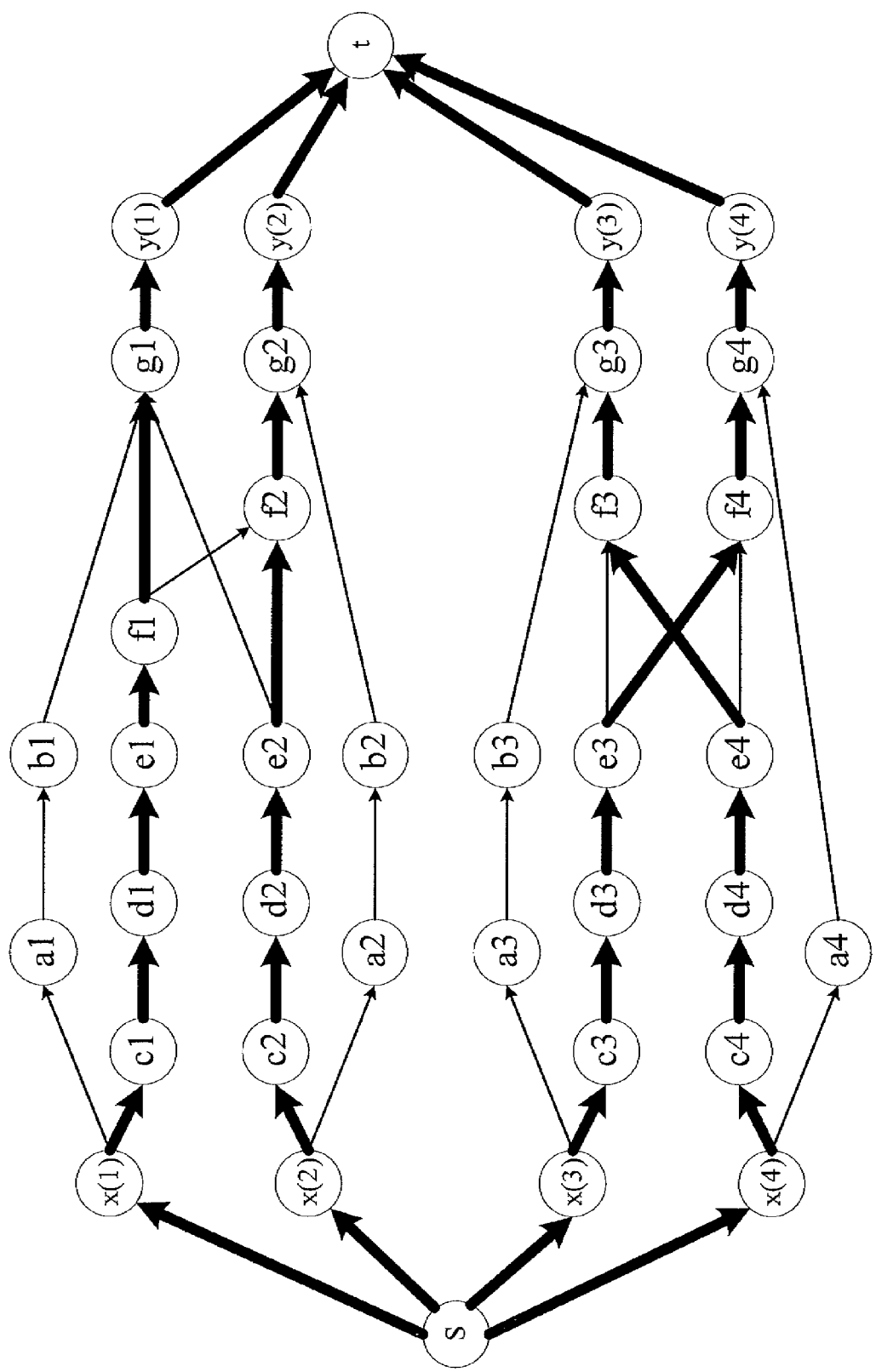
FIGS. 6(A)-6(D) illustrate one example of optimal main frame identification solutions constructed from group-pieces of two other optimal main frame identification solutions, according to the present disclosure.
Figure 6B:
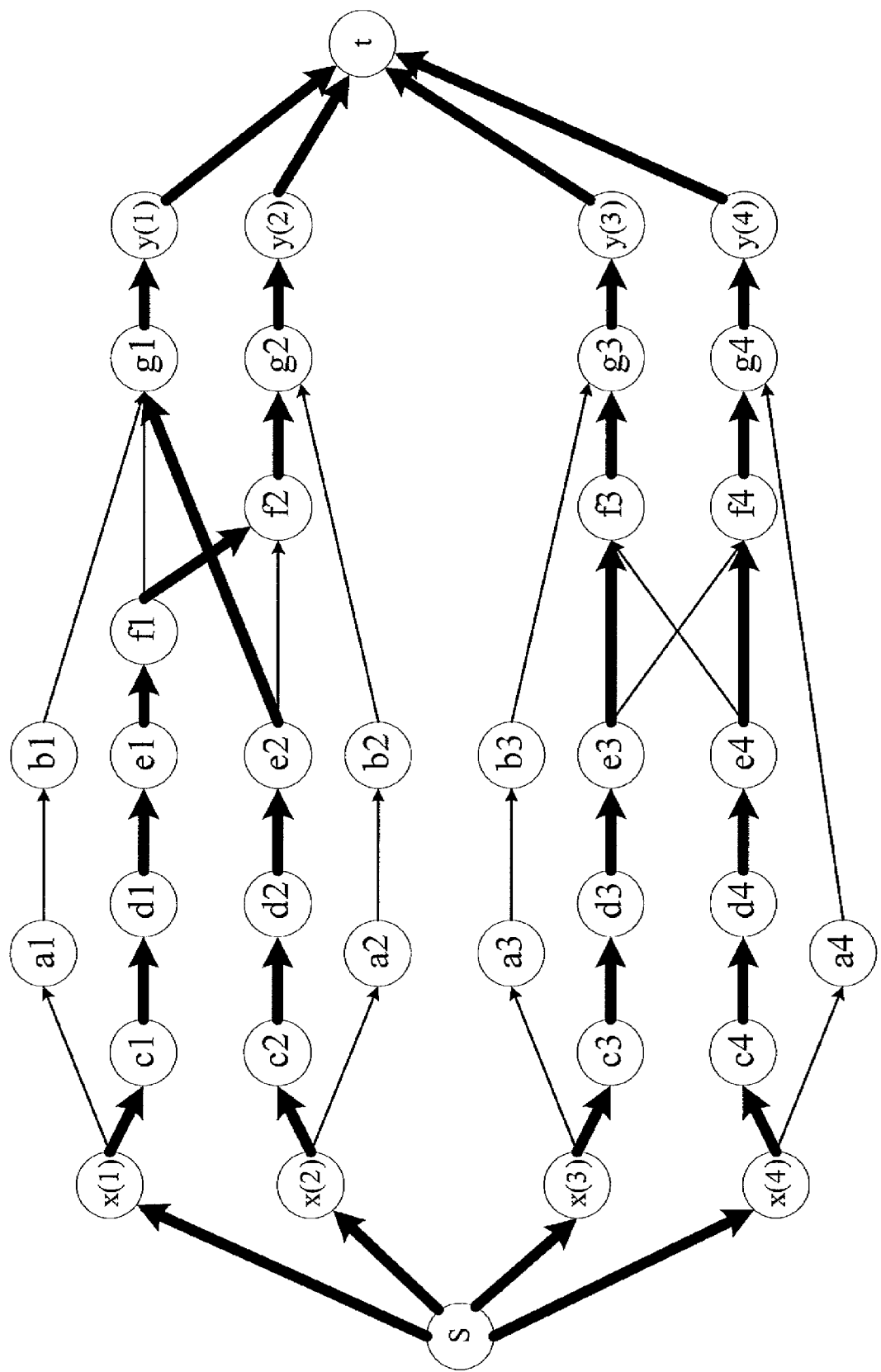

An additional process to obtain optimal MFI solutions comprises group-piece based flow creation. For example, with at least two optimal MFI solutions, these optimal MFI solution can be partitioned into groups such that different combinations of the flows from each group also lead to optimal MFI solution(s). As shown in FIGS. 6(A) and 6(B), if the first two flow paths are considered as one group (Group1), and the last two flow paths are considered as another group (Group2), the grouping can be expressed as:

Group1={x(1),x(2)}→{y(1),y(2)}
Group2={x(3),x(4)}→{y(3),y(4)}.

Figure 6C:
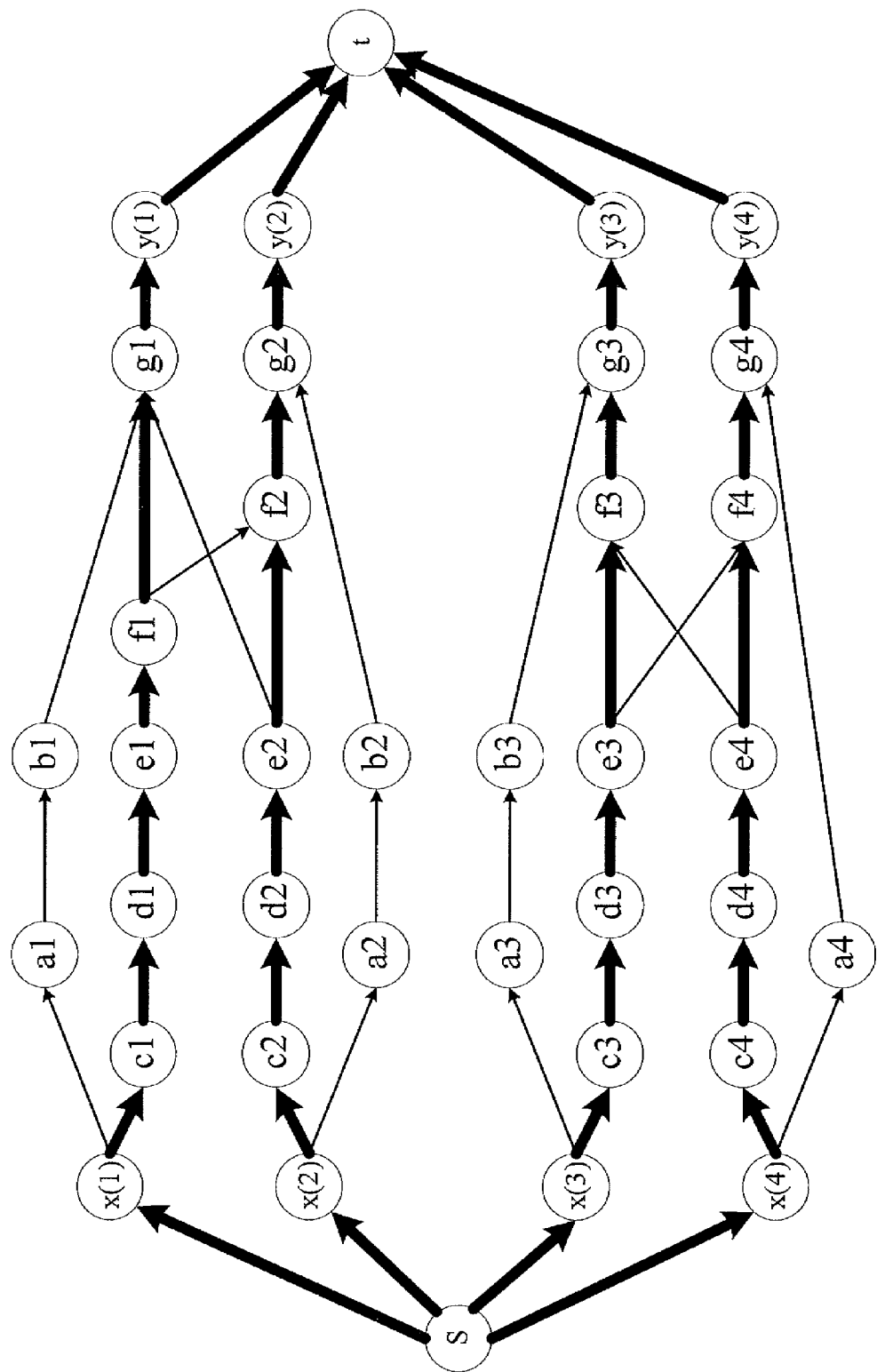

Note that the optimal flow solutions on each group do not share any nodes or edges. Accordingly, in various embodiments a new flow solution can be created from different MFI solutions by piecing together the different groups from each of the original optimal MFI solutions. As shown in the flow network in FIG. 6(C), the flows for Group1 are from FIG. 6(A), while the flows for Group2 are from FIG. 6(B). This new network flow is also an optimal MFI solution.

Figure 6D:
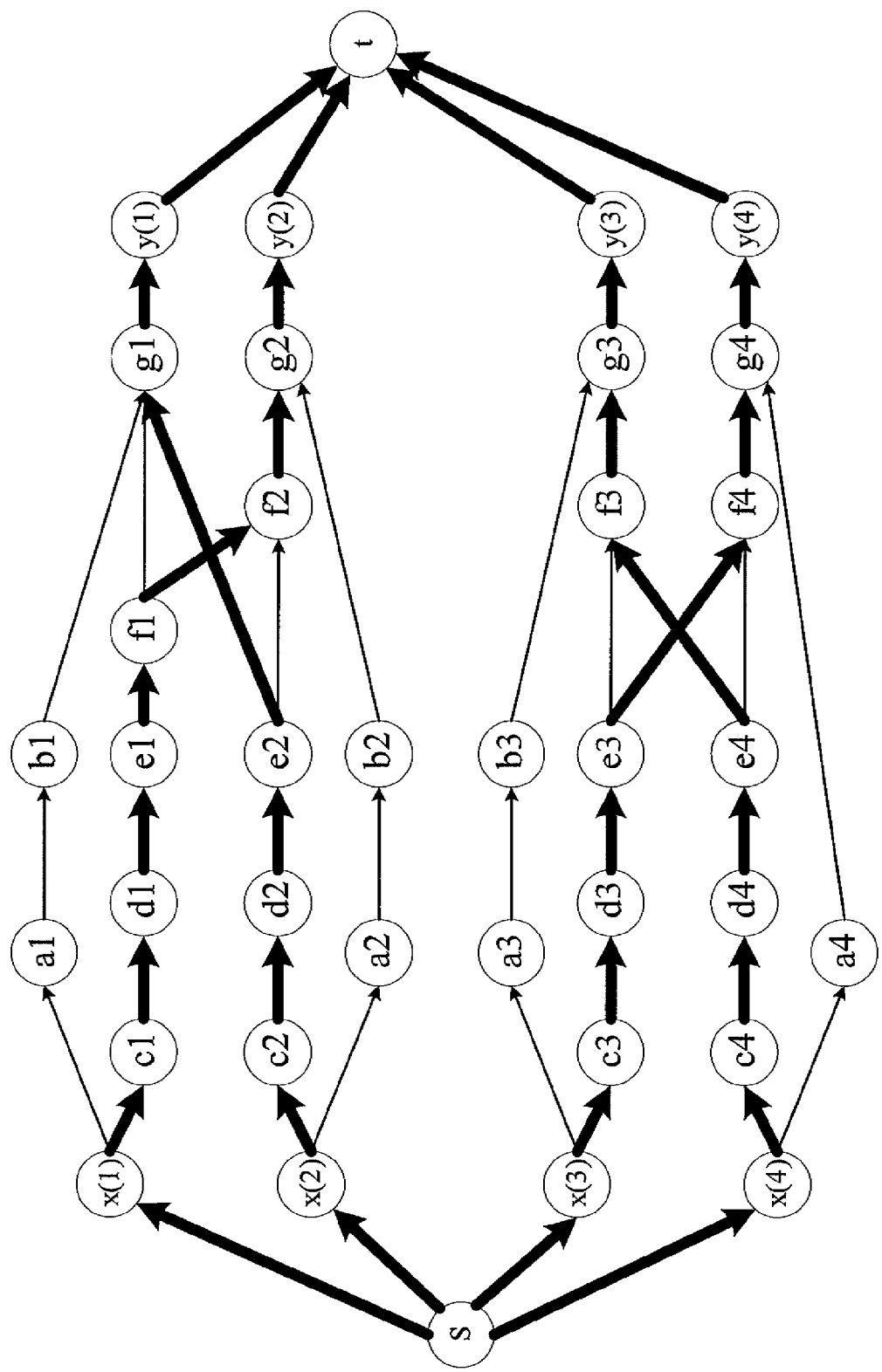
Figure 7:
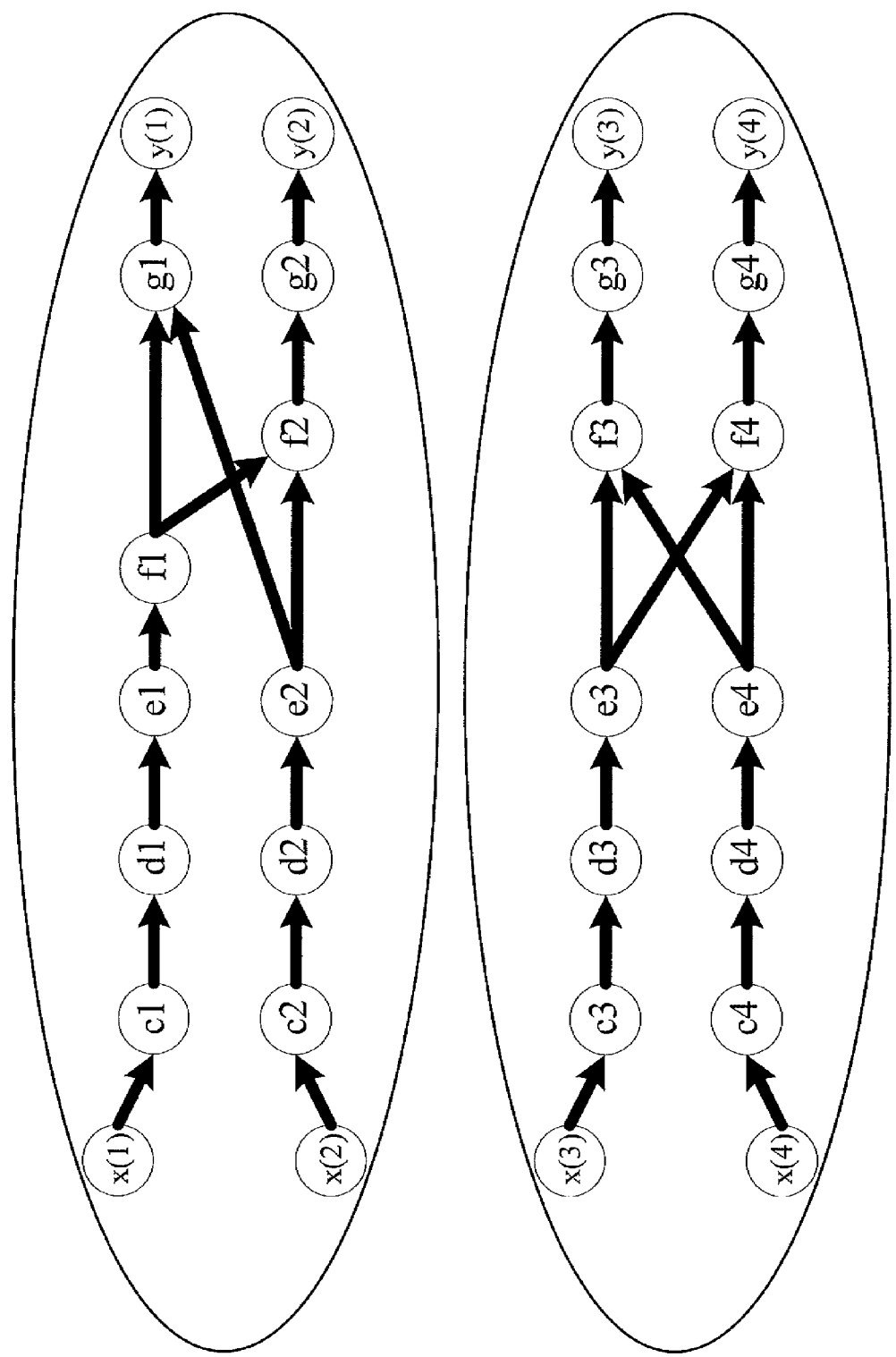
FIG. 7 illustrates a composite flow solution generated from the FIGS. 6(A) and 6(B), according to one embodiment of the present disclosure.

In one embodiment, the group identification can be implemented according to the following algorithm:

Algorithm. Group_Identification(Flow1, Flow2)
1. For node v in Flow1 ∪Flow2 excluding s and t
2. add v to $V_p$;
3. For edge e in Flow1 ∪Flow2 excluding edges with s or t
4. add e to $E_p$;
5. Find the disjoint subgraphs from $G_p=(V_p, E_p)$;
6. return disjoint subgraphs;

Through step 5, the goal is to merge two MFI solutions into one graph $G_r$. Then $G_r$ includes all the flow paths from two solutions. If there are disjoint subgraphs, it means that the flow solution on each subgraph is independent from each other. Therefore, for each subgraph, a flow solution can incorporate bit slices from either of the given MFI solutions, and the new flow solution is still an optimal MFI solution. For the two MFI solutions in FIGS. 6(A) and 6(B), $G_p$ may be constructed through the Group_Identification algorithm as shown in FIG. 7. In the graph 700 shown in FIG. 7 (e.g., corresponding to graph $G_p$ mentioned above), there are two disjoint subgraphs as illustrated by dash ellipses. For each subgraph, its flow solution can originate from the MFI solution from either FIG. 6(A) or FIG. 6(B), and two new MFI solutions are obtained as FIG. 6(C) and FIG. 6(D).

The entire process of group-piece based flow creation can be summarized with the following theorem.

Theorem 2

For any two optimal solutions of a given MFI problem, another optimal solution can be obtained by identifying the disjoint groups with Group_Identification, and then for each group, copying the flow solution from either of the given MFI solutions.

It should be noted that the bit matching derived from MFI solutions is the ultimate goal of generating additional MFI solutions. Therefore, it is not strictly necessary to copy flows for each group to create new flows (e.g., as shown in FIG. 7 for illustrative purposes). Instead, only the bit matching solution needs to be copied for each group.

Iterative Bit Slicing Improvement

Various criteria may be used to evaluate the quality of a datapath bit slicing solution. For example, in various embodiments the total number of datapath gates covered by bit slices, the distribution of gate numbers for each slice, and the like (or even combinations of such criteria), can be defined to evaluate the bit slicing quality. Thus, if there are multiple bit slicing solutions, a datapath bit slice evaluation can be called to pick the best one.

For example, multiple MFI optimal solutions can be created using the above techniques (e.g., flow network adjustment, group-piece based flow creation, etc.). In one embodiment, an iterative approach is used to improve datapath bit slicing solutions. The bit slice evaluation function will take the MFI flow results to return the "best" bit matching solution. In particular, in one embodiment a two-way search extraction is performed n times for each bit pair. The n resulting bit slices are derived for evaluation. In one embodiment, the algorithm is as follows.

Algorithm Iterative_Slice_Improvement(S, T, $G_d$, $G_f$, InitFlow)
1. BestCost=Evaluate Bit Slice Solution(InitFlow);
2. BestFlow=InitFlow;
3. for(i=0; i<NumIter; i++) {
4. Adjust Flow Network Cost($G_f$, $G_d$, BestFlow);
5. NewFlow=min-cost max-flow on $G_f$;
6. Groups=Group Identification(BestFlow, NewFlow);
7. for each group g in Groups {
8. WorkFlow=BestFlow
9. replace WorkFlow flow in g with that in NewFlow
10. NewCost=Evaluate Bit Slice Solution(NewFlow);
11. if(NewCost>BestCost)
12. BestCost=NewCost;
13. BestFlow=WorkFlow;
14. }
15. }
16. Return the slicing solution derived from BestFlow In one embodiment, the "cost" of a particular bit slicing solution can be defined as:

$$C = \alpha \cdot \Sigma_{i=1}^n G_i - \beta \cdot \Sigma_{i=1}^n |G_i - Gavg|$$

where $G_i$ is the number of gates in the $i^{th}$ bit slice, $G_{avg}$ is the average of $G_i$, and where $\alpha$ and $\beta$ are user defined parameters. In other words, in one embodiment the cost function maximizes the number of gates in all of the datapath bit slices while minimizing the variance between the number of gates in each of the respective bit slices.

In summary, the present disclosure is directed to identifying datapath bit slices. To solve the bit slicing problem, the gates along the datapath are first determined, i.e., datapath extraction. In one embodiment, the datapath extraction employs a two-way search algorithm to extract all gates between the two vectors. It should be noted that these gates should cover all bit slice gates, but it is not necessary that each extracted gate belongs to a certain bit. For example, in FIG. 2, the OR2 gate between Bit3 and Bit4 gets extracted, but it doesn't belong to any bit slice. Then next step involves performing a bit matching on a flow network corresponding to the extracted datapath graph, i.e., finding a bit-to-hit matching between the starting vector S and the ending vector T. To address the bit matching problem, a main frame problem is solved for the extracted datapath graph. In one embodiment, the main frame problem is solved with a min-cost max-flow algorithm (e.g., giving a main frame solution). From the main frame solution, the bit slicing solution is derived. For example, in one embodiment, once a starting point and an ending point are determined, or matched, a second two-way search extraction algorithm is applied to get one bit slice (and applied again to extract each additional bit slice according).

Furthermore, a flow network, as described in the above examples, may have multiple optimal min-cost max-flow solutions, while min-cost max flow algorithm(s) only return one. To address this issue, two effective techniques are proposed, adjusting flow network and combining flow solutions. These techniques generate additional optimal flow solutions so that an iterative approach can be used to produce a best-cost optimal bit slicing solution.

Figure 8:
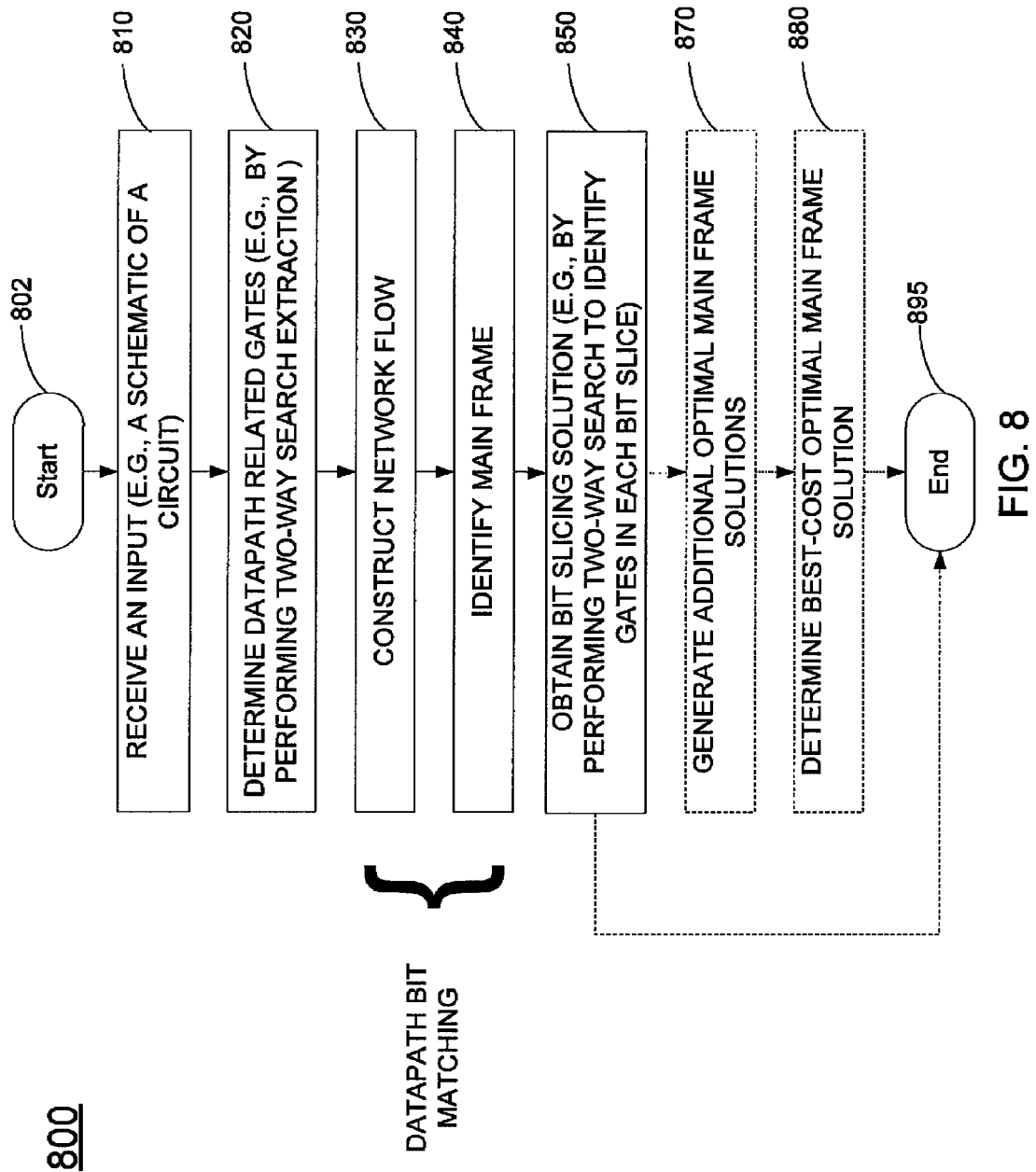
FIG. 8 illustrates a flowchart of an exemplary method according to one embodiment of the present disclosure.

FIG. 8 illustrates a flowchart of an exemplary method 800 for determining datapath bit slices (e.g., for an integrated circuit). In particular, the method 800 incorporates aspects of the above described processes/algorithms into a combined process that, from start to finish, generates optimal datapath bit slices for an input netlist (e.g., starting from an integrated circuit design). The steps of the method 800 may be implemented, in one embodiment, by a computing device, such as a general purpose computer having a processor, a memory, a module and/or input/output devices. For example, the method may be performed by the general purpose computer illustrated in FIG. 9, specifically programmed to perform steps of the method 800 (e.g., instructions stored in a memory and/or module for determining datapath bit slices and executed by a processor). However, the method 800 is not limited to implementation by a particular computing device, e.g., a general purpose computer in accordance with FIG. 9 and may, in fact, be implemented by various other devices having alternative configurations and components.

The method 800 is initialized at step 802 and proceeds to step 810, where the method receives a netlist, HDL or VHDL file, or other input, such as a schematic that is representative of a circuit, or other circuit design (e.g., for an integrated circuit, a sub-micron integrated circuit, and the like). For example, a schematic may include an array of input bits, an array of output bits, a number of gates connected to the input bits, to the output bits and to each other, as well as the associated connections. The method then proceeds to step 820.

At step 820, the method 800 identifies datapath related gates. For example, a two-way search is performed in order to extract/derive datapath related gates between a starting (or input) vector and ending (or output) vector. In one embodiment, the two-way search is performed according to the above described two-way search extraction algorithm/process in order to generate a "datapath graph" (e.g., $G_d$).

Following step 820, the method 800 proceeds to step 830 where a network flow, or netflow is constructed. This is the first of two steps in deriving a datapath bit matching. In one embodiment, the network flow (also referred to herein as a netflow, a network graph, or simply a graph, e.g., $G_f$) is constructed in accordance with the above described main frame identification by flow algorithm. In one embodiment, weights are assigned to the nodes (and in some embodiments, the edges) of the flow network according to the above described algorithm. In addition, in one embodiment, the construction of the flow network at step 830 comprises node splitting (e.g., as illustrated in FIG. 3 and described above). The method 800 then proceeds to step 840 where a main frame, or main frame solution, is identified.

In step 840, the method 800 identifies at least one main frame solution to the flow network generated in step 830. In one embodiment, the main frame solution is found by applying the main frame identification by flow algorithm described above. For example, in one embodiment, the method 800 may, at step 840 apply a min-cost max-flow algorithm (e.g., a breadth first search, a uniform cost search, and the like) to the flow network generated in step 830 in order to determine a main frame solution to the flow network. In one embodiment, the main frame solution found at step 840 identifies a bit matching between an input vector and an output vector of the input netlist. For example, each starting bit in the input, or starting vector is matched to one bit in the output, or ending vector.

At step 850, the method 800 obtains a bit slicing solution. For example, in one embodiment a second two-way search is applied to the datapath graph (e.g., $G_f$) created at step 820 above. For example, in one embodiment the second two-way search comprises setting an individual bit in the input vector as the starting point (S) and a corresponding individual bit in the output vector as the ending point (T) and finding all gates in the datapath graph having two-way connectivity to both S and T. In general, each starting point and ending point is determined according to the bit matching of the main frame solution. The resulting gates, and the path from S to T traversing such gates, comprise a single bit line. This process is repeated for all bit pairs to derive each of the corresponding bit lines. Collectively, the resulting bit lines determined though such a process may be referred to as the bit slicing solution. In one embodiment, the method 800 may output the bit slicing solution. For example, the method 800 may output the bit slicing solution to a display (e.g., in graphical form, such as shown in FIG. 1), or may output the solution to a file which may comprise a netlist, a HDL or VHDL file, and the like. In addition, such files may also be displayed for viewing, editing and the like (e.g., on a display of a computer, such as computer 900 in FIG. 9).

In one embodiment, following step 850, the method 800 proceeds to step 895 where the method terminates. However, in some embodiments, additional refinements to the main frame solution (or bit slicing solution) are provided. For example, in one embodiment, following step 850, the method 800 proceeds to step 870 where additional optimal main frame solutions are identified. For example, in one embodiment, the method 800 may perform a flow adjustment (e.g., according to the flow adjustment algorithm described above) to identify one or more additional main frame solutions. In one embodiment, the method 800 may further derive additional main frame solutions by grouping pieces from earlier found main frame solutions (e.g., through a group-piece based flow creation algorithm describe above).

Following step 870, the method 800 proceeds to step 880 where the best-cost main frame solution is determined. In one embodiment, step 880 comprises applying a cost formula to each main frame solution (or more specifically, to the corresponding bit slice solution), to determine the "best" solution. In one embodiment, the "cost" of a particular bit slicing solution can be defined as:

$$C = \alpha \cdot \Sigma_{i=1}^{n} Gi - \beta \cdot \Sigma_{i=1}^{n} |Gi - Gavg|$$

where $G_i$ is the number of gates in the $i^{th}$ bit slice, $G_{avg}$ is the average of $G_i$, and where $\alpha$ and $\beta$ are user defined parameters. In other words, in one embodiment the cost function maximizes the number of gates in all of the datapath bit slices while minimizing the variance between the number of gates in each of the respective bit slices. In one embodiment, the solution with the best cost is returned as a final bit slicing solution. In one embodiment, the final bit slicing solution may further be output or displayed, as described above. The method 800 then proceeds to step 895 where the method terminates.

In addition, although not expressly specified above, one or more steps of method 800 may include a storing, displaying and/or outputting step as required for a particular application. In other words, any data, records, fields, and/or intermediate results discussed in the method can be stored, displayed and/or outputted to another device as required for a particular application. Furthermore, steps or blocks in FIG. 8 that recite a determining operation or involve a decision do not necessarily require that both branches of the determining operation be practiced. In other words, one of the branches of the determining operation can be deemed as an optional step. In addition, although the steps of the method 800 are listed in a particular order, as shown in FIG. 8, it should be noted that alternate embodiments of the present disclosure may implement these steps in a different order.

Figure 9:
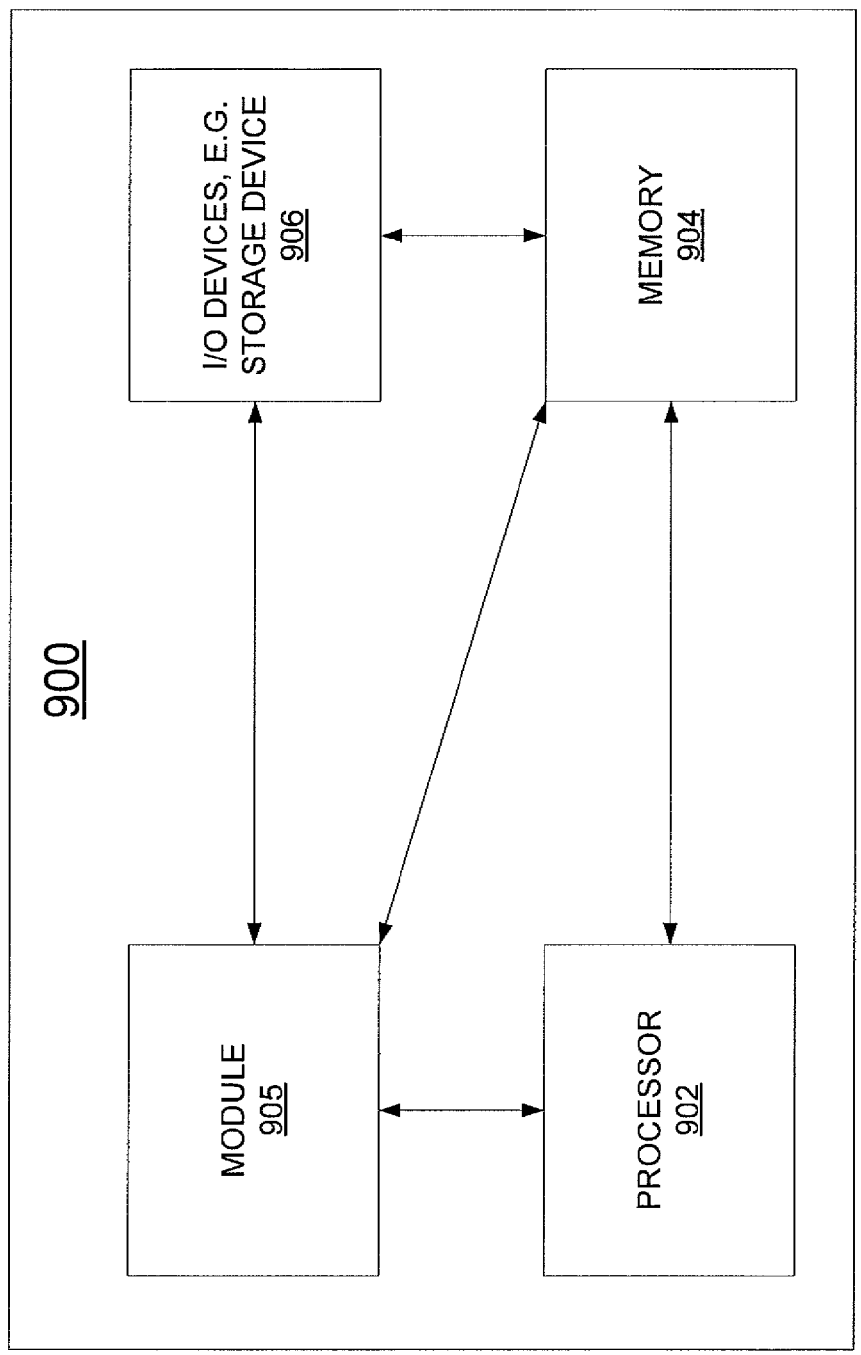
FIG. 9 is a high level block diagram of the present disclosure implemented using a general purpose computing device.

FIG. 9 is a high level block diagram of a general purpose computing device 900 that can be used to implement embodiments of the present disclosure for determining datapath bit slices, as described above. It should be understood that embodiments of the disclosure can be implemented as a physical device or subsystem that is coupled to a processor through a communication channel. Therefore, in one embodiment, a general purpose computing device 900 comprises a processor 902, a memory 904, a module 905 for determining datapath bit slices, and various input/output (I/O) devices 906 such as a display, a keyboard, a mouse, a modem, and the like. In one embodiment, at least one I/O device is a storage device (e.g., a disk drive, an optical disk drive, a floppy disk drive).

Alternatively, embodiments of the present disclosure (e.g., module 905 for determining datapath bit slices) can be represented by one or more software applications (or even a combination of software and hardware, e.g., using Application Specific Integrated Circuits (ASIC)), where the software is loaded from a storage medium (e.g., 110 devices 906) and operated by the processor 902 in the memory 904 of the general purpose computing device 900. Thus, in one embodiment, the module 905 for determining datapath bit slices described herein with reference to the preceding Figures can comprise computer-readable code stored on a computer readable medium (e.g., RAM, magnetic or optical drive or diskette, and the like). In various embodiments, the module 905 for determining datapath bit slices may comprise computer readable code corresponding to any one or more, or all of the above described algorithms, methods and processes for performing various aspects of the present disclosure (e.g., the process described in the exemplary method 900 and/or any one or more of the above described algorithms and processes, as well as implementation specific variations thereof).

Although various embodiments which incorporate the teachings of the present disclosure have been shown and described in detail herein, those skilled in the art can readily devise many other varied embodiments that still incorporate these teachings.

What is claimed is:

1. A computer-based method for determining datapath bit slices, comprising:
    determining all gates in a datapath between an input vector and an output vector;
    constructing a network flow including the gates identified;
    identifying a main frame solution of the network flow, wherein the main frame solution matches a starting bit in the input vector to an ending bit in the output vector; and
    obtaining a bit slicing solution corresponding to the main frame solution by extracting those of the gates in the datapath that reside between the starting bit and the ending bit, wherein the obtaining the bit slicing solution comprises associating at least one gate in the datapath with one of a plurality of bit slices in the bit slicing solution, wherein the at least one gate in the datapath is associated with the one of the plurality of bit slices by performing a two-way search between each of the starting bit and the ending bit representing the one of the plurality of bit slices,
wherein at least one of: the determining, the constructing, the identifying, or the obtaining is performed using a processor.

2. The computer-based method of claim 1, further comprising:
receiving an input representing a circuit design comprising the input vector, the output vector and a plurality of gates, wherein the gates in the datapath are selected from the plurality of gates in the circuit design.

3. The computer-based method of claim 1, wherein the determining all gates in the datapath comprises performing a two-way search between the input vector and the output vector.

4. The computer-based method of claim 3, wherein the two-way search comprises a breadth-first search or a depth-first search.

5. The computer-based method of claim 1, wherein the obtaining a bit slicing solution comprises performing a two-way search between each of the starting bit and the ending bit of each of a plurality of matching bit pairs in the bit slicing solution.

6. The computer-based method of claim 1, wherein the identifying the main frame solution comprises applying a min-cost max-flow algorithm to the network flow, wherein the min-cost max-flow algorithm computes a maximum flow at a minimum cost for the network flow.

7. The computer-based method of claim 6, wherein the applying a min-cost max-flow algorithm to the network flow to identify a main frame solution comprises:
deriving matching bit pairs between the input vector and the output vector.

8. The computer-based method of claim 1, wherein the main frame solution comprises a set of disjoint paths from the input vector to the output vector that covers a maximum number of the gates in the datapath.

9. The computer-based method of claim 1, wherein the gates in the datapath comprise only gates that have paths to both the input vector and the output vector.

10. The computer-based method of claim 1, wherein the at least one gate in the datapath is associated with the one of the plurality of bit slices if the at least one gate has connectivity to the starting bit in the input vector and the ending bit in the output vector.

11. The computer-based method of claim 1, further comprising:
outputting the bit slicing solution.

12. The computer-based method of claim 1, wherein the constructing the network flow further comprises:
expanding nodes in the network flow corresponding to each of the gates in the datapath to include an input node, an output node, and an edge connecting the input node to the output node.

13. The computer-based method of claim 12, wherein the expanding nodes further comprises:
assigning a node weight to each edge connecting each input node to each output node.

14. The computer-based method of claim 1, further comprising:
generating at least one additional bit slicing solution; and
selecting a best cost bit slicing solution from among the bit slicing solution and the at least one additional bit slicing solution.

15. The computer-based method of claim 14, wherein the identifying the main frame solution comprises applying a min-cost max-flow algorithm to the network flow and wherein the generating at least one additional bit slicing solution comprises:
assigning a cost to each edge in the network flow that corresponds to a bit slice of the bit slicing solution; and
re-applying the min-cost max-flow algorithm to the network flow to generate the at least one additional bit slicing solution.

16. The computer-based method of claim 14, wherein the generating at least one additional bit slicing solution comprises:
assigning bit slices in each of the bit slicing solution and at least a second bit slicing solution to each of a plurality of disjoint groups;
selecting from the plurality of disjoint groups at least a first disjoint group associated with the bit slicing solution and at least a second disjoint group associated with the at least a second bit slicing solution; and
combining the at least a first disjoint group with the at least a second disjoint group to generate the at least one additional bit slicing solution.

17. A non-transitory computer-readable storage device having stored thereon a plurality of instructions, the plurality of instructions including instructions which, when executed by a processor, cause the processor to perform a method for determining datapath bit slices, comprising:
determining all gates in a datapath between an input vector and an output vector;
constructing a network flow including the gates identified;
identifying a main frame solution of the network flow, wherein the main frame solution matches a starting bit in the input vector to an ending bit in the output vector; and
obtaining a bit slicing solution corresponding to the main frame solution by extracting those of the gates in the datapath that reside between the starting bit and the ending bit, wherein the obtaining the bit slicing solution comprises associating at least one gate in the datapath with one of a plurality of bit slices in the bit slicing solution, wherein the at least one gate in the datapath is associated with the one of the plurality of bit slices by performing a two-way search between each of the starting bit and the ending bit representing the one of the plurality of bit slices.

18. An apparatus for determining datapath bit slices, comprising:
a processor configured to:
determinine all gates in a datapath between an input vector and an output vector;
construct a network flow including the gates identified;
identify a main frame solution of the network flow, wherein the main frame solution matches a starting bit in the input vector to an ending bit in the output vector; and
obtain a bit slicing solution corresponding to the main frame solution by extracting those of the gates in the datapath that reside between the starting bit and the ending bit, wherein the obtaining the bit slicing solution comprises associating at least one gate in the datapath with one of a plurality of bit slices in the bit slicing solution, wherein the at least one gate in the datapath is associated with the one of the plurality of bit slices by performing a two-way search between each of the starting bit and the ending bit representing the one of the plurality of bit slices.

* * * * *